United States Patent
Yao et al.

(10) Patent No.: US 8,222,664 B2
(45) Date of Patent: Jul. 17, 2012

(54) BACKLIGHT MODULE AND LIGHT EMITTING DIODE MODULE THEREOF

(75) Inventors: Yuan-Jung Yao, Hsin-Chu (TW); Shau-Yu Tsai, Hsin-Chu (TW); Yun-Yi Tien, Hsin-Chu (TW); Chih-Lin Wang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 229 days.

(21) Appl. No.: 12/482,721

(22) Filed: Jun. 11, 2009

(65) Prior Publication Data

US 2010/0033987 A1    Feb. 11, 2010

(30) Foreign Application Priority Data

Aug. 5, 2008   (TW) ................. 97129729 A

(51) Int. Cl.
*H01L 33/00*   (2010.01)
(52) U.S. Cl. ........... 257/99; 257/100; 313/512; 362/362
(58) Field of Classification Search .............. 257/99, 257/100; 313/512; 362/362
See application file for complete search history.

(56) References Cited

U.S. PATENT DOCUMENTS

| | | | | |
|---|---|---|---|---|
| 7,153,000 B2 * | 12/2006 | Park et al. | ...... | 362/268 |
| 7,153,002 B2 | 12/2006 | Kim et al. | | |
| 7,837,360 B2 * | 11/2010 | Lee | ...... | 362/335 |
| 2002/0080615 A1 * | 6/2002 | Marshall et al. | ...... | 362/333 |
| 2006/0034097 A1 | 2/2006 | Hahm et al. | | |
| 2006/0083000 A1 | 4/2006 | Yoon et al. | | |
| 2006/0198144 A1 | 9/2006 | Miyairi et al. | | |
| 2007/0010157 A1 * | 1/2007 | Sorg | ...... | 445/25 |
| 2007/0080636 A1 * | 4/2007 | Lee | ...... | 313/512 |
| 2007/0182323 A1 * | 8/2007 | Ogata et al. | ...... | 313/512 |
| 2007/0217192 A1 | 9/2007 | Hiratsuka | | |
| 2007/0273282 A1 * | 11/2007 | Radkov et al. | ...... | 313/512 |
| 2008/0030878 A1 | 2/2008 | Saxena et al. | | |
| 2008/0031010 A1 | 2/2008 | Kim et al. | | |
| 2008/0062715 A1 | 3/2008 | Park et al. | | |

FOREIGN PATENT DOCUMENTS

| | | |
|---|---|---|
| JP | H10-093716 | 4/1989 |
| JP | H10-260404 | 9/1998 |
| JP | 2006-189519 | 7/2006 |
| JP | 2006-276728 | 10/2006 |
| JP | 2006-286905 | 10/2006 |
| JP | 2006-286907 | 10/2006 |
| JP | 2007-005791 | 1/2007 |

(Continued)

OTHER PUBLICATIONS

English language translation of abstract of JP 2006-276728.

(Continued)

*Primary Examiner* — Anthony Ho
(74) *Attorney, Agent, or Firm* — Thomas, Kayden, Horstemeyer & Risley, LLP

(57) ABSTRACT

A light emitting diode contains a package structure and a light emitting diode die embedded in the package structure. The package structure has an elliptic bottom surface having a semi-major axes and a semi-minor axis and a semi-ellipsoidal surface connecting and surrounding the edge of the elliptic bottom surface, wherein the maximum height of the ellipsoidal surface from the elliptic bottom surface is between the semi-major axes and the semi-minor axis.

8 Claims, 7 Drawing Sheets

FOREIGN PATENT DOCUMENTS

| | | |
|---|---|---|
| JP | 2007-041605 | 2/2007 |
| TW | 200720781 A | 6/2007 |

OTHER PUBLICATIONS

English language translation of abstract of JP 2007-041605.
English language translation of abstract of JP 2006-189519.
English language translation of abstract of JP 2007-005791.
English language translation of abstract of JP 2006-286905.
English language translation of abstract of JP 2006-286907.
English language translation of abstract of JP H10-260404.
English language translation of abstract JP H10-093716.
English translation of abstract and pertinent parts of TW 200720781 A, Feb. 10, 2012.

* cited by examiner

BACKLIGHT MODULE AND LIGHT EMITTING DIODE MODULE THEREOF

RELATED APPLICATIONS

This application claims priority to Taiwan Application Serial Number 97129729, filed Aug. 5, 2008, which is herein incorporated by reference.

BACKGROUND

1. Field of Invention

The present invention relates to a backlight module. More particularly, the present invention relates to a light emitting diode.

2. Description of Related Art

A back light module is one of the most important parts of a liquid crystal display (referred to as LCD). Since the liquid crystal is not the luminous body, the LCD panel is illuminated by the back light module. The back light module typically includes a light source, a light guide plate and many optical films such as diffuser. Among all kinds of light sources of the back light module, the light emitting diode (refer to as LED) has gradually become the most popular light source because it has the properties of the high brightness, long lifetime, small size, and low energy consumption. Nowadays, the luminous intensity of the LED has been improved, which means the desired luminance of the backlight module can be achieved with fewer LEDs. The utilization of fewer LEDs lowers the cost of the backlight module. However, when fewer LEDs are used, the gaps among LEDs are wider. If the light emitted from the LED is not strong enough to illuminate the wider gap, a dark line may be formed on the light guide plate corresponding to the gap area, and furthermore, non-uniform light may be provided to the LCD panel. In addition, if the large angle of the light emitted from the LED can not be increased as the gap space increased, the dark line on the light guide plate would become more obvious, which may lead to the panel with non-uniform brightness also. In other words, it is difficult to handle the panel with uniform brightness and reduce the quantity of the LED at the same time.

In addition, electronic devices are becoming thinner and lighter, so it is necessary to thin the LCD as well. As the LCD becomes thinner, the backlight module and the light guide plate thereof also become thinner. When the thickness of the light guide plate is almost as small as the thickness of the LED, the angular distribution of light field of the LED in the vertical direction may be too broad and some of light may leak out from the light guide plate, which may lead to light leakage problems.

Therefore, a new backlight module and a new LED thereof are necessary. The new LED may have different angular distribution of light field in different directions. In a horizontal direction, the light field should be strong enough at a large angle to prevent generating dark lines. In the vertical direction, the light field should be limited to small angles to ensure that each light beam is incident on the light guide plate to prevent light leakage problems.

SUMMARY

A light emitting diode module(refer to as LED module) with different light fields in horizontal and vertical directions is provided. The LED module comprises a package structure and a light emitting diode die, wherein the die is embedded in the package structure. The package structure is almost like a semi-ellipsoid, which has an elliptic bottom surface and an ellipsoidal surface. The elliptic bottom surface has a semi-major axis and a semi-minor axis perpendicular to each other. The ellipsoidal surface is surrounding and connects the edge of the elliptic bottom surface. The largest vertical distance from the ellipsoidal surface to the elliptic bottom surface is between the length of the semi-major axis and the length of the semi-minor axis.

The shape of the package structure may affect the distribution of light field of the LED module, especially the angular distribution of light field. The angular distribution of light field may be broader along the direction of the semi-major axis of the elliptic bottom surface, and the angular distribution of light field may be smaller along the direction of the semi-minor axis of the elliptic bottom surface.

Another LED module is provided. The LED module has a light emitting diode die embedded in a package structure. The shape of the package structure may cause a larger angular distribution of light field in a horizontal direction and a smaller angular distribution of light field in a vertical direction.

The package structure has a bottom surface, a pair of planes, and a curved surface. The planes face each other and separately connect two opposite sides of the bottom surface. The curved surface connects the planes. The cross-section of the curved surface vertical to the bottom surface is an elliptic curve. The LED module further includes a plurality of reflective structures disposed separately on the planes. The ellipsoidal surface may cause different light field distribution in different directions.

Furthermore, this invention discloses a backlight module, which contains a light emitting diode die, a package structure, and a light guide plate. The shape of the package structure may help changing the angular distribution of light field.

The package structure is disposed between the die and the light guide plate, and directs light emitted from the die to the light guide plate. The package structure is like a semi-ellipsoid, which has a bottom surface in the shape of an ellipse and an ellipsoidal surface. The elliptic bottom surface has a semi-major axis and a semi-minor axis. The ellipsoidal surface connects the bottom surface, wherein the largest vertical distance from the ellipsoidal surface to the bottom surface is between the length of the semi-major axis and the length of the semi-minor axis. In the embodiment of this invention, the die is embedded in the package structure and the ellipsoidal surface of the package structure contacts the light guide plate.

In the foregoing, the package structure may direct light emitted from the die and change the angular distribution of light field in different direction. In a horizontal direction, the light field in the large angle of the package structure may be increased to prevent the dark line issue. In the vertical direction, the light field may be limited to a small angle, which may prevent light leaking out of the light guide plate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
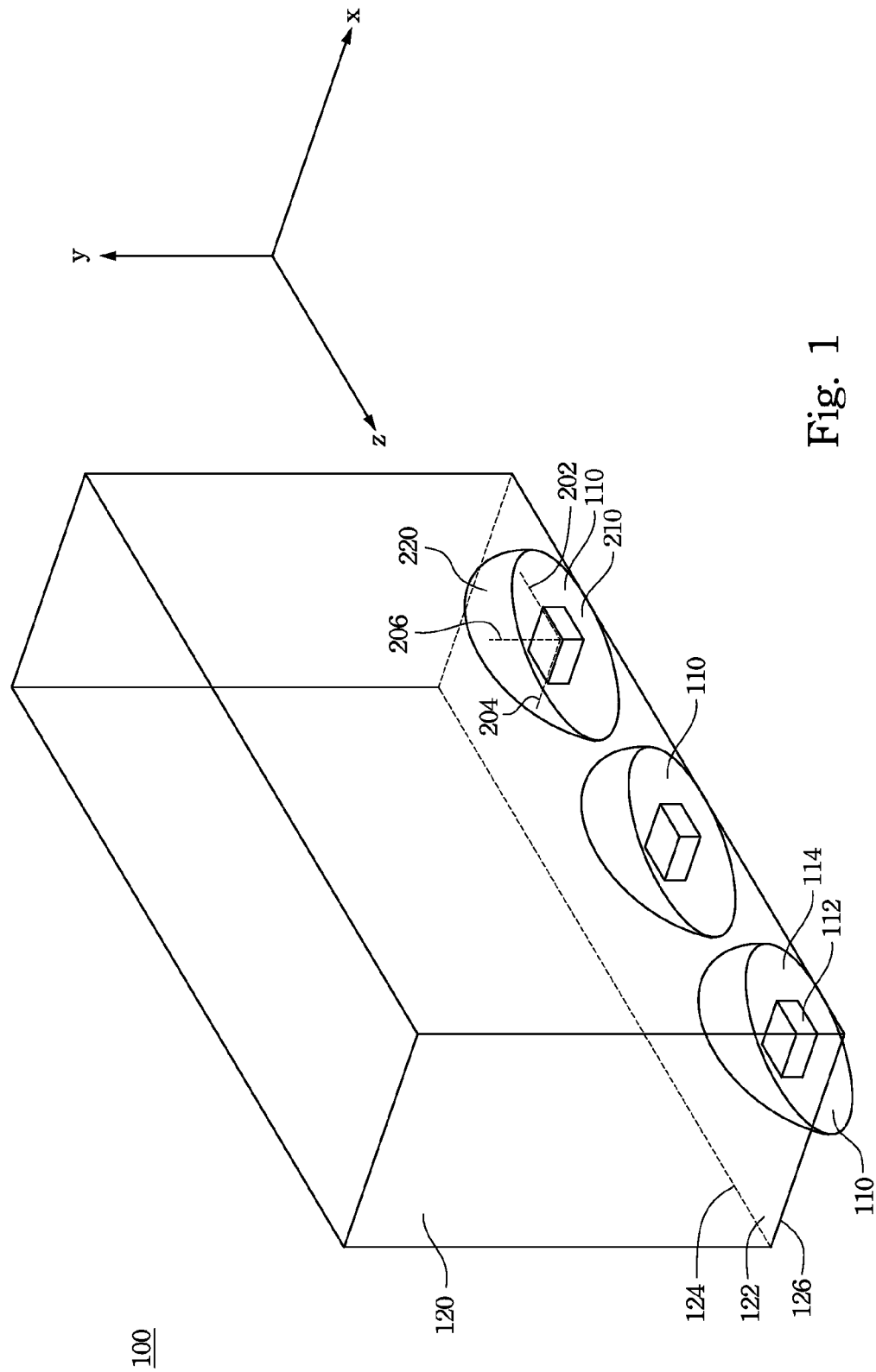
FIG. 1 is a three-dimensional diagram of a backlight module according to an embodiment of this invention.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1. FIG. 1 is a three-dimensional diagram of a backlight module 100 according to an embodiment of this invention. The backlight module 100 supplies light to the liquid crystal display (referred to as LCD). In the embodiment of this invention, the backlight module 100 at least contains light emitting diode modules (refer to as LED modules) 110 and a light guide plate 120. The light guide plate 120 may guide light emitted from the LED modules 110 to a panel (not shown) of the LCD. The LED module 110 includes a light emitting diode die 112 and a package structure 114, wherein the die 112 is embedded in the package structure 114. The package structure 114 may spread light emitted from the die 112 to the light guide plate 120. The shape of the package structure 114 may cause different angular distributions of light field in a horizontal direction and a vertical direction.

Figure 2:
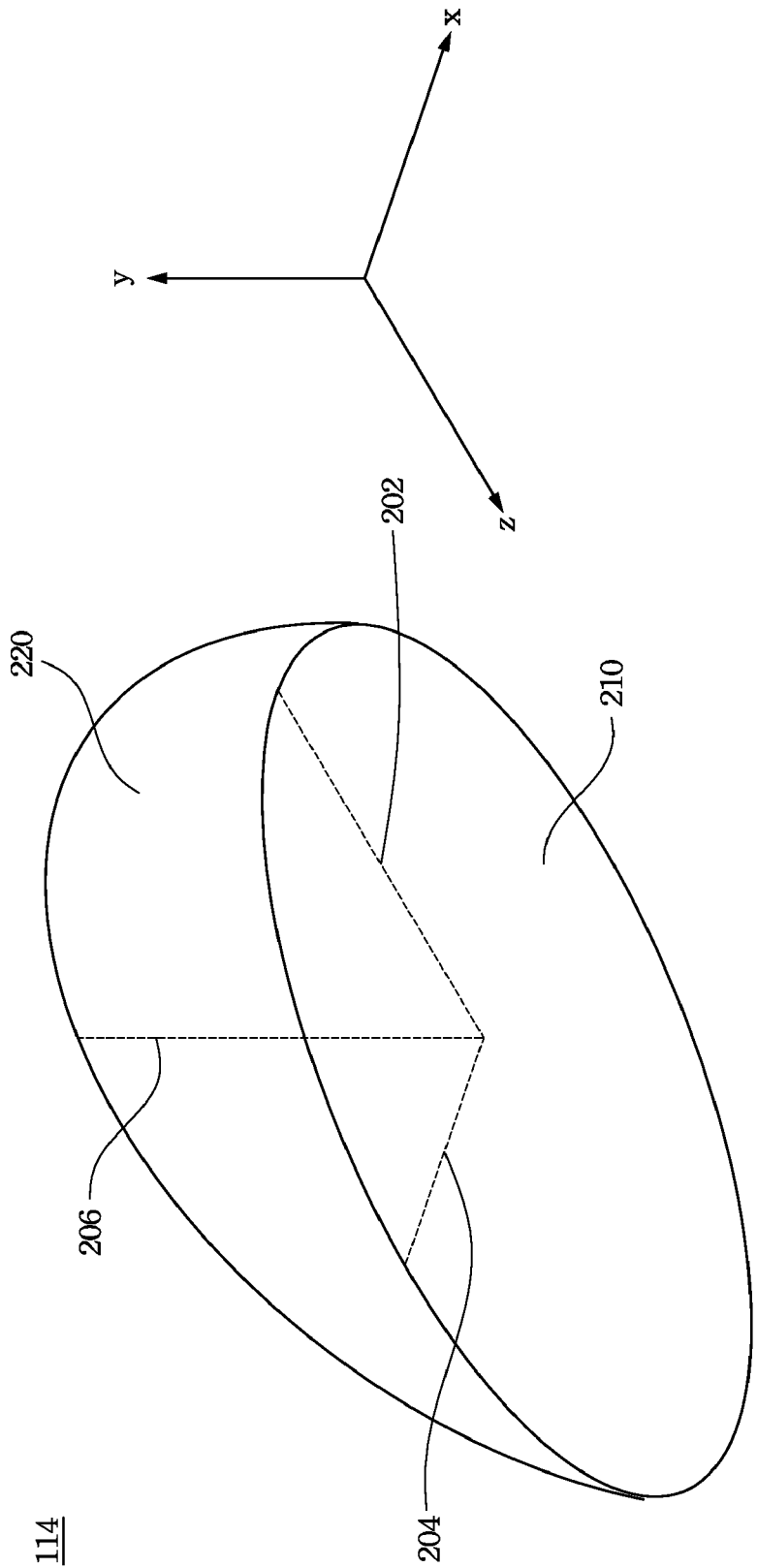
FIG. 2 is a three-dimensional diagram of the package structure shown in FIG. 1.

Please refer to FIG. 1 and FIG. 2 at the same time. FIG. 2 is a three dimensional diagram of the package structure 114 according to the embodiment of this invention. The LED modules 110 are disposed right next to the light guide plate 120. In the embodiment of this invention, the LED modules 110 even contact the light guide plate 120.

The package structure 114 is almost like a semi-ellipsoid, which has an elliptic bottom surface 210 and a curved surface 220. The curved surface 220 covers over the elliptic bottom surface 210 and also connects to the elliptic bottom surface 210. In the embodiment of this invention, the curved surface 220 is disposed next to or directly contacted to the light guide plate 120. The die 112 is embedded in the package structure 114 and is disposed on the bottom surface 210. More specifically, the die 112 is disposed in the center of the bottom surface 210.

In general, an ellipse can use its major axis and minor axis to determine its curvature. In the embodiment of this invention, the elliptic bottom surface 210 has a semi-major axis 202 and a semi-minor axis 204, wherein the semi-major axis 202 is longer than the semi-minor axis 204. In the embodiment of this invention, the length of the semi-major axis 202 is ranging from about the semi-minor axis 204 to four times the length of the semi-minor axis 204.

The edge of the curved surface 220 surrounds the edge of the elliptic bottom surface 210 and also connects to the edge of the elliptic bottom surface 210. In addition, to cut the curved surface 220 in a direction vertical to the bottom surface 210, a cross-section of the curved surface 220 is a semi-ellipse like curve. This shows the curved surface 220 is a semi-ellipsoid like surface. More specifically, a cross-section of the curved surface 220 is a semi-elliptic curve. This shows the curved surface 220 is a semi-ellipsoidal surface.

The largest vertical distance from the curved surface 220 to the elliptic bottom surface 210 is a height 206 of the package structure 114. The height 206 is between the length of the semi-major axis 202 and the length of the semi-minor axis 204. More specifically, the height 206 is almost equal to or longer than twice of the length of the semi-minor axis 204. And, the height 206 is almost equal to or smaller than the length of the semi-major axis 202. In the embodiment of this invention, the length of the semi-major axis 202 is ranging from about the height 206 to twice the height 206, which means the length of the semi-major axis 202 is longer than the height 206 and smaller than twice the height 206.

In the embodiment of this invention, the curved surface 220 is a semi-ellipsoidal surface, and the center of curvature of the curved surface 220 is located in the center of the elliptic bottom surface 210. Therefore, the semi-major axis 202, the semi-minor axis 204, and the height 206 can determine the curvature of the curved surface 220.

The light guide plate 120 is in a shape of a flat rectangular parallelepiped. A plane of the light guide plate 120 contacting or next to the LED modules 110 is called an incidence plane 122. The incidence plane 122 is rectangular and has a longer side 124 and a shorter side 126. The direction of the longer side 124 represents the extension direction of the light guide plate 120, and the length of the shorter side 126 represents the thickness of the light guide plate 120. The incidence plane 122 of the light guide plate 120 is next to or directly contact curved surface 220 of the package structure 114 of the LED module 110. The height 206 of the package structure 114 is perpendicular to the incidence plane 122. The semi-major axis 202 is parallel to the longer side 124 of the incidence plane 122. The semi-minor axis 204 is parallel to the shorter side 126 of the incidence plane 122.

The LED modules 110 are arranged along the longer side 124 of the incidence plane 122 and spaced apart from each other with the same gap. As the above, light emitted from the LED modules 110 must be bright enough to cover the gap between the LED modules 110. Therefore, the light field in large angle of the LED module 110 is strong enough to cover the gap in the horizontal direction, which is parallel to the semi-major axis 202 and the longer side 124. As the light guide plate 120 become thinner, the shorter side 126 of the incidence plane 122 also become shorter. Therefore, the light field of the LED module 110 should be converged in the vertical direction to ensure that each light beam is incident on the light guide plate to prevent light leakage problems.

Figure 3:
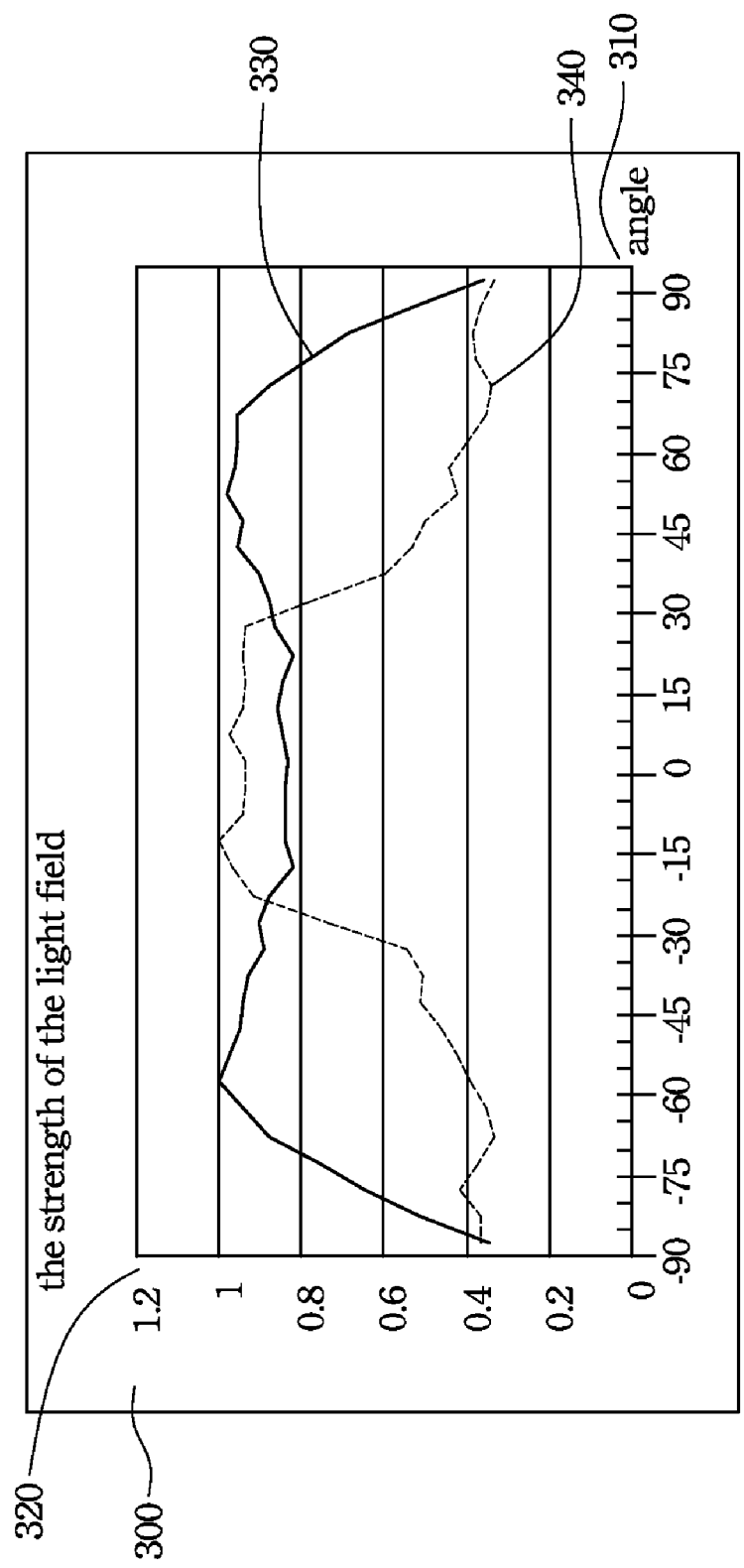
FIG. 3 is a plot of an angular distribution of light field of the package structure shown in FIG. 2.

Please refer to FIG. 2 and FIG. 3. FIG. 3 is a plot 300 of an angular distribution of light field of the package structure 114. The angular distribution of the light field plot 300 represents relations between light field and angle of light directed from the curved surface 220 of the package structure 114. To describe clearly, coordinates are added in FIG. 2, wherein the X-axis is parallel to the semi-minor axis 204, and Y-axis is parallel to the height 206, and the Z-axis is parallel to the semi-major axis 202.

A transverse axis of the angular distribution of light field plot 300 represents angle. When perpendicular to the bottom surface 210 of the package structure 114, the angle is defined as 0 degree. When turning clockwise toward the edge of the bottom surface 210, the angle becomes bigger. When parallel to the bottom surface 210, the angle is defined as 90 degree. On the contrary, when turning counter-clockwise toward the edge of the bottom surface 210, the angle becomes negative and becomes smaller. When parallel to the bottom surface 210, the angle is defined as −90 degrees. Please notice that the angle described later may be positive though, the angle should be treated as the positive angle and the negative angle with symmetry. A longitudinal axis of the angular distribution of light field plot 300 represents the strength of the light field after being normalized, which means a ratio of measurement value to the maximum measurement value of the light field.

A first curve 330 represents an angular distribution of the light field in a direction parallel to the semi-major axis 202 and vertical to the semi-minor axis 204, which means the relation of light field and angle in Y-Z plane. As the plot 300 shows, the strength of the light field is about above 0.8, which is 80% of the maximum measurement value of the light field, between 0 degrees and 70 degrees. When the angle is between about 80 degrees and about 90 degrees, especially when equal to 85 degrees, the strength of the light field is about 0.5, which means half of the maximum measurement value of light field. It is obvious that light directed by the package structure 114 may improve the strength of light field at the large angles. Therefore, the LED module 110 is able to shine in a broad range of angles to prevent generating dark lines.

A second curve 340 represents an angular distribution of light field in a direction parallel to the semi-minor axis 204 and vertical to the semi-major axis 202, which means the relation of light field and angle in X-Y plane. As the plot 300 shows, the strength of the light field is about above 0.8 between 0 degrees and 25 degrees. When the angle is larger about 30 degrees, the strength of the light field decreases dramatically. When the angle is larger about 35 degrees, especially when equal to 40 degrees, the strength of light field is about 0.5, which means half of the maximum measurement value of light field. It is obvious that light being directed by the package structure 114 may limit the strength of light field in small range of angles to make light field converged and then prevent light leakage problems.

Figure 4:
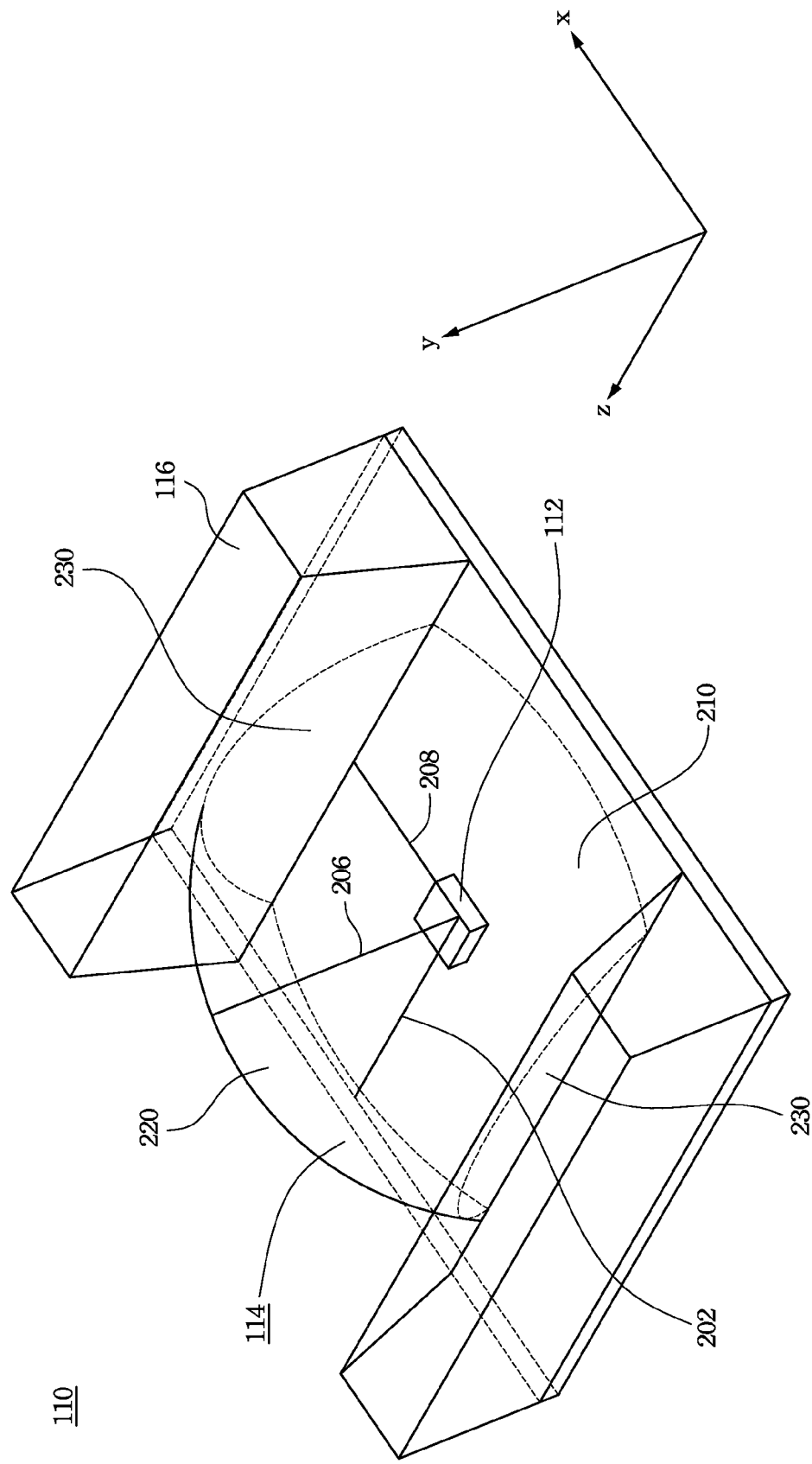
FIG. 4 is a three-dimensional diagram of a light emitting diode according to another embodiment of this invention.
Figure 5:
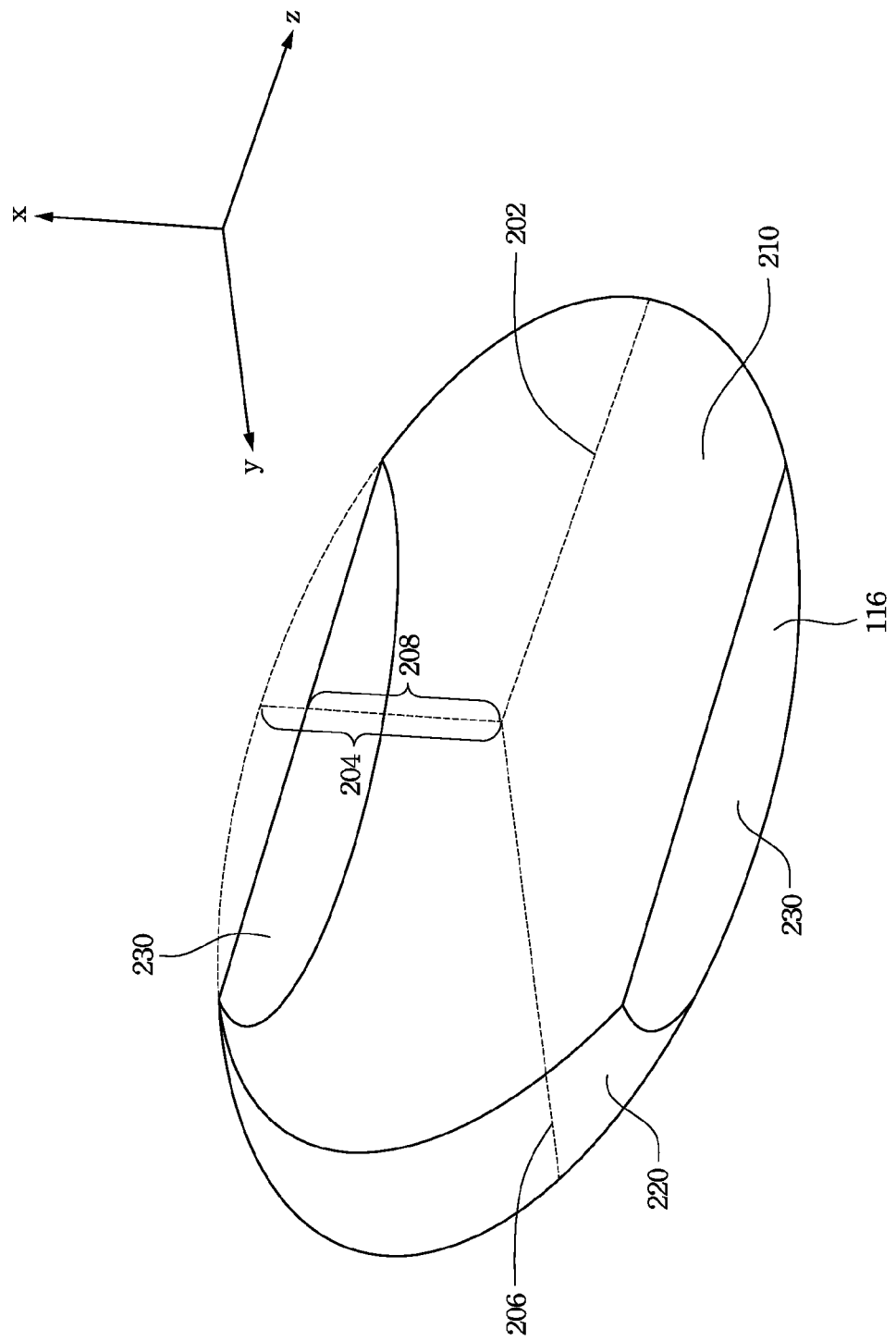
FIG. 5 is a three-dimensional diagram of the package structure shown in FIG. 4.

Please refer to FIG. 4 and FIG. 5. FIG. 4 is a three-dimensional diagram of an LED module 110 according to another embodiment of this invention, and FIG. 5 is a three-dimensional diagram of the package structure 114 of the LED module 110. In the embodiment of this invention, the package structure 114 further has a pair of planes 230 facing each other, almost perpendicular to the bottom surface 210, and separately connecting the curved surface 220 and two opposite sides of the bottom surface 210. In the view of making the package structure 114 method, forming a semi-ellipsoid firstly which comprises the bottom surface 210 and the curved surface 220 and then cutting two opposite sides of the curved surface 220 of the semi-ellipsoid to form the planes 230.

Each plane 230 is the cross-section plane of semi-ellipsoid from the curved surface 220 to the bottom surface 210. The planes 230 are not vertical to the bottom surface 210 in the embodiment of this invention. In another embodiment of this invention, the planes 230 may be vertical to the bottom surface 210. The planes 230 are almost vertical to the semi-minor axis 204. In the embodiment of this invention, the planes 230 are parallel to each other, are symmetrical to the center of the bottom surface 210 and are parallel to the semi-major axis 202 and vertical to the semi-minor axis 204. Obviously, a distance between the planes 230 is between twice of the length of the semi-minor axis 204 and the length of the die 112. In other words, a space 208 between the plane 230 and the center of the bottom surface 210 is smaller than the length of the semi-minor axis 204 and longer than half of the length of the die 112.

In order to enhance the convergent effect of the light field in the vertical direction, the LED module 110 has reflective structures 116 to reflect the light with the large angle in the vertical direction, which is parallel to the semi-minor axis 204. More specifically, the reflective structure 116 is disposed adjacent to the curved surface 220, where the curved surface 220 connects the semi-minor axis 204 on the elliptic bottom surface 210. In the embodiment of this invention, the reflective structures 116 are disposed on the planes 230.

In modern technology, there are many different types of reflective structures 116. For example, the reflective structures 116 may be a reflective layer, and the reflective layer can be a metal coating layer, multi-layer coating layer, or the layer with the dot pattern. This type structure is directly formed on the plane 230 made of high reflectance material with a coating such as a reflective layer like metal coating, or multi-layer coating. The reflective structures 116 may have other type structures to reflect or to refract light, such as grating structures, V-cut structures, or other micro-structures, which may guide light to the front of the package structure 114.

Figure 6:
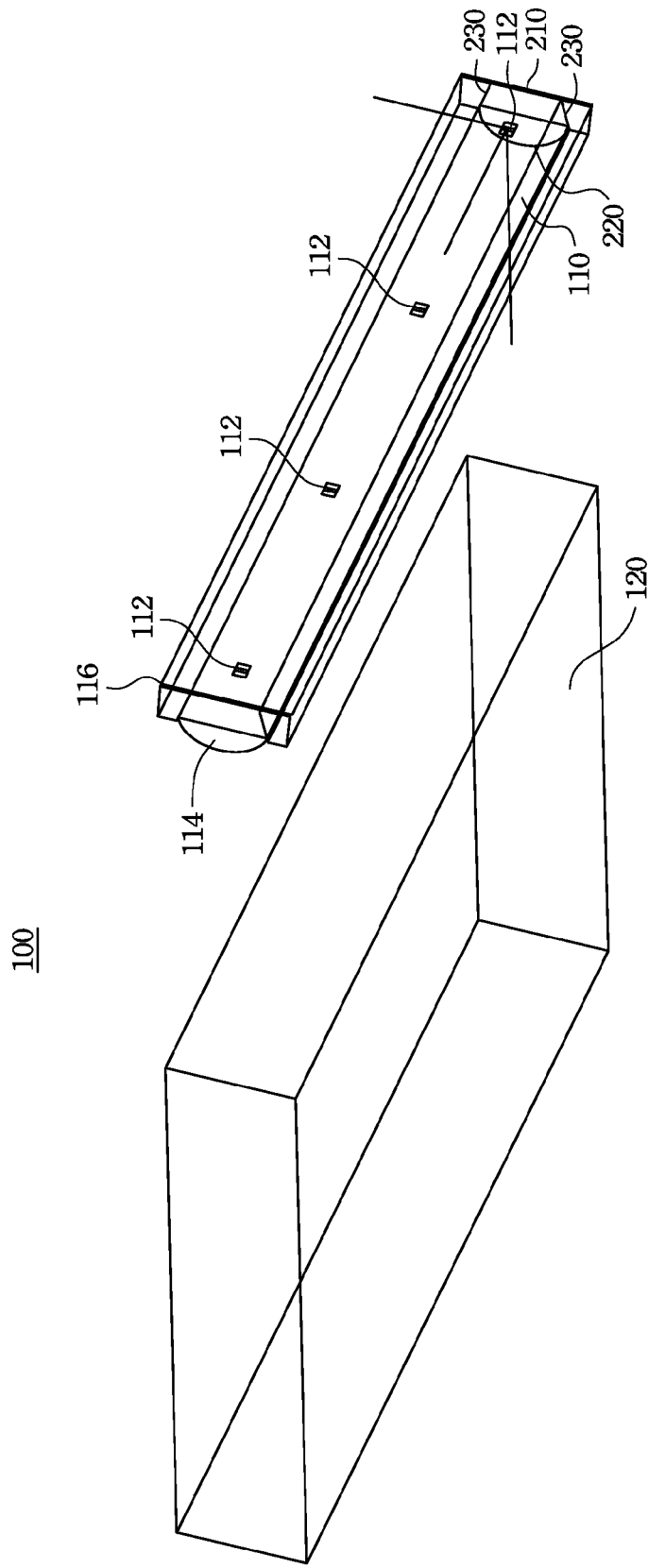
FIG. 6 is a three-dimensional diagram of a backlight module according to another embodiment of this invention.
Figure 7:
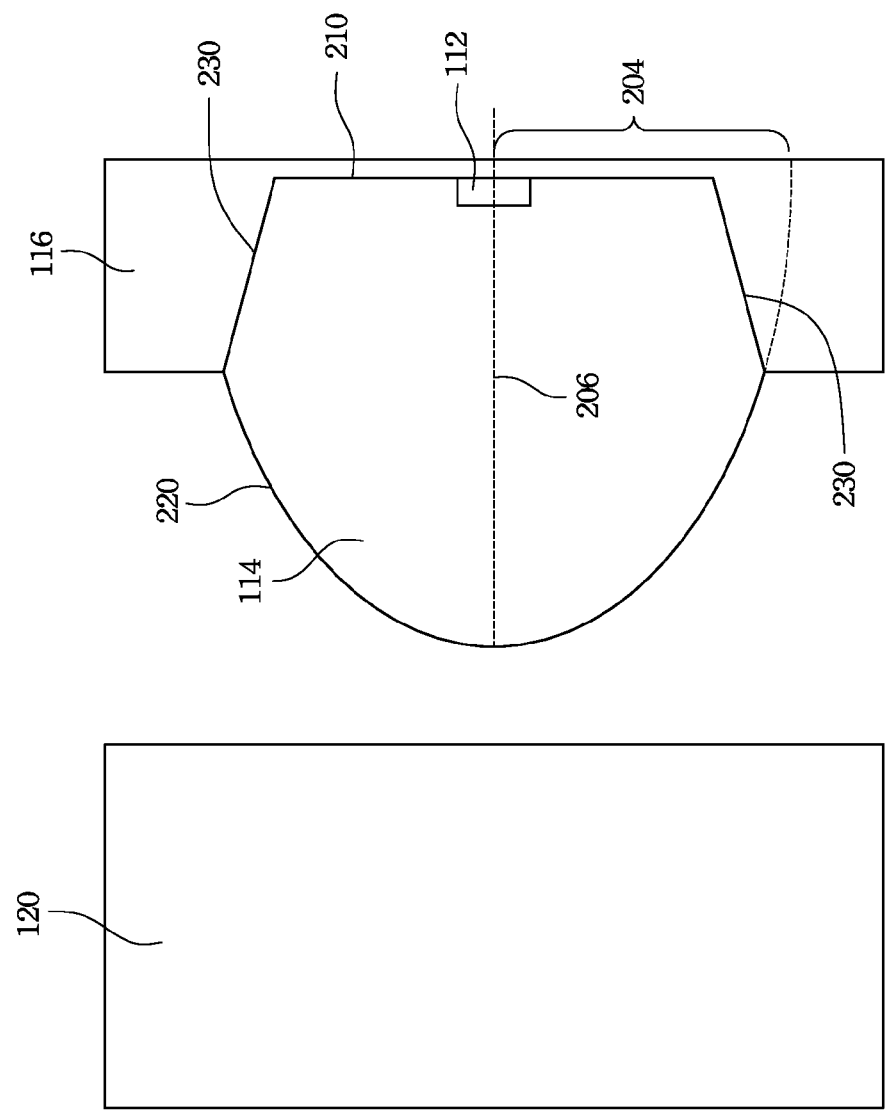
FIG. 7 is a cross-section diagram of the backlight module shown in FIG. 6.

Please refer to FIG. 6 and FIG. 7. FIG. 6 is a three-dimensional diagram of a backlight module 100 according to another embodiment of this invention, and FIG. 7 is a cross-section diagram of the backlight module 100 in Y-Z plane.

In the embodiment of this invention, the package structure 114 of the LED module 110 is in the shape of a bar. Specifically, the bar has an isosceles trapezoid like cross-section with one curve side. The package structure 114 of the LED module 110 has a bottom surface 210 as the base of the bar, two opposite planes 230 as the two sides of the bar (namely, they are the two legs of the isosceles trapezoid like cross-section), and a curved surface 220 as the upper face of the bar. The planes 230 are facing each other and are of equal length and width. The two opposite sides of the plane 230 respectively connect the curved surface 220 and the bottom surface 210.

Each of the planes 230 and the bottom surface 210 is like a strip or a rectangle, wherein an extension direction, a direction of a long side, is parallel to the X-axis. To cut the curved surface 220 in a direction vertical to the bottom surface 210 and parallel to Y-Z plane, a cross-section of the curved surface 220 is the part of an elliptic curve. The curvature of the elliptic curve can be defined by the height 206 and the semi-minor axis 204. In other words, the elliptic curve also has a semi-major axis vertical to the bottom surface 210 and equal to the largest vertical distance from the curved surface 220 to the bottom surface 210, the height 206 of the package structure 114. As the above, the height 206 is longer than twice of the length of the semi-minor axis 204.

In the embodiment of this invention, the package structure 114 further includes a reflective structure 116 disposed on the planes 230. The reflective structure 116 comprises the metal coating structure, the grating structure, the V cut structure, or other micro-structure.

The dies 112 of the LED module 110 are disposed on the bottom surface 210 of the package structure 114, and arranged along the extension direction of the bottom surface 210. The curved surface 220 of the package structure 114 contacts or is disposed next to the light guide plate 120. As the above, the cross-section of the curved surface 220 is the long and narrow elliptic curve, which may limit light field in a small range of angles. Therefore, all light beams emitted from the LED module 110 may be collected and incident to the light guide plate 120 to prevent the light leakage problem.

In the foregoing, the angular distribution of light field is related to the shape of the package structure 114. This invention discloses many embodiments and the package structure 114 thereof. By shaping the curved surface 220 as a semi-ellipsoidal surface or a semi-elliptic pillar surface, the angular distribution of light field in the horizontal direction and the vertical direction are different.

Although the present invention has been described in considerable detail with reference certain embodiments thereof, other embodiments are possible. Therefore, their spirit and scope of the appended claims should no be limited to the description of the embodiments container herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode module, comprising:
a package structure comprising:
   a bottom surface, wherein the bottom surface is in a shape of an ellipse and has a semi-major axis and a semi-minor axis;
   a pair of planes facing each other and separately connecting two opposite sides of the bottom surface; and
   a curved surface connecting the planes, wherein the cross-section of the curved surface vertical to the bottom surface is a semi-elliptic curve, and a largest vertical distance from the curved surface to the bottom surface is between the length of the semi-major axis and the length of the semi-minor axis;
at least a light emitting diode die embedded in the package structure; and
a plurality of reflective structures disposed separately on the planes.

2. The light emitting diode module of claim 1, wherein the planes are parallel to each other and both perpendicular to the semi-minor axis, a distance between the planes being between twice of the length of the semi-minor axis and the length of the light emitting diode die.

3. The light emitting diode module of claim 1, wherein the largest vertical distance from the curved surface to the bottom surface is larger than twice of the length of the semi-minor axis.

4. The light emitting diode module of claim 1, wherein the length of the semi-major axis is smaller than twice of the largest vertical distance from the curved surface to the bottom surface.

5. The light emitting diode module of claim 1, wherein the semi-elliptic curve has a major axis and a minor axis, the length of the major axis being larger than twice of the length of the minor axis.

6. The light emitting diode module of claim 1, wherein the bottom surface is in the shape of a rectangle, the direction of a longer side of the rectangle is perpendicular to the cross-section of the curved surface.

7. The light emitting diode module of claim 1, wherein the package structure is in the shape of a bar comprising an isosceles trapezoid like cross-section.

8. The light emitting diode module of claim 1, wherein each reflective structure is a metal coating structure, a grating structure, a V-cut structure, or a micro-structure.

* * * * *